(12) United States Patent
Hegde et al.

(10) Patent No.: US 12,671,062 B2
(45) Date of Patent: Jun. 30, 2026

(54) VIRTUAL SHUTTER IN ION BEAM SYSTEM

(71) Applicant: Plasma-Therm NES LLC, St. Petersburg, FL (US)

(72) Inventors: Sarpangala Hariharakeshava Hegde, Fremont, CA (US); Armin Baur, Largo, FL (US); Wei-Hua Hsiao, St. Petersburg, FL (US); Russell Westerman, Land O' Lakes, FL (US)

(73) Assignee: Plasma-Therm NES LLC, St. Petersburg, FL (US)

( * ) Notice: Subject to any disclaimer, the term of this patent is extended or adjusted under 35 U.S.C. 154(b) by 200 days.

(21) Appl. No.: 17/727,723

(22) Filed: Apr. 23, 2022

(65) Prior Publication Data

US 2023/0343557 A1 Oct. 26, 2023

(51) Int. Cl.
 H01J 37/32 (2006.01)
 H01J 37/20 (2006.01)
 (Continued)

(52) U.S. Cl.
 CPC .......... H01J 37/3233 (2013.01); H01J 37/20 (2013.01); *C23C 4/00* (2013.01); *C23C 14/00* (2013.01);
 (Continued)

(58) Field of Classification Search
 CPC ....... H01L 37/20; H01L 37/3233; C23C 4/00; C23C 14/00; C23C 14/0021; C23C 14/0052; C23C 14/221; C23C 14/34
 (Continued)

(56) References Cited

U.S. PATENT DOCUMENTS 4,278,493 A * 7/1981 Petvai ................... B08B 7/0035
 134/1
4,579,807 A * 4/1986 Blonder .............. C23C 14/0688
 430/935
(Continued)

FOREIGN PATENT DOCUMENTS

CN 108441838 A 8/2018
JP H06 176728 A 6/1994
 (Continued)

OTHER PUBLICATIONS

International Search Report and Written Opinion, Feb. 16, 2024, PCT/US2023/015039, European Patent Office.
 (Continued)

*Primary Examiner* — Brian K Talbot
(74) *Attorney, Agent, or Firm* — Harvey S. Kauget, Esq.; Burr & Forman LLP

(57) ABSTRACT

The present disclosure provides a method of processing a substrate within an ion beam system. The substrate has a top surface that has a plurality of features, an edge and a bottom surface. The substrate is placed on a wafer stage and an energetic particle beam having a radial flux distribution over at least a portion of a major dimension thereof is ignited. The energetic particle beam is stabilized while the bottom surface of the substrate is oriented toward the major dimension of the energetic particle beam. The wafer stage with the substrate is oriented so that the top surface of the substrate is exposed to the major dimension of the energetic particle beam. After stabilization of the energetic particle beam, the plurality of features on the top surface of the substrate are exposed to the energetic particle beam in a treatment zone.

5 Claims, 2 Drawing Sheets

(51) Int. Cl.
C23C 4/00 (2016.01)
C23C 14/00 (2006.01)
C23C 14/22 (2006.01)
C23C 14/34 (2006.01)

(52) U.S. Cl.
CPC ...... *C23C 14/0021* (2013.01); *C23C 14/0052* (2013.01); *C23C 14/221* (2013.01); *C23C 14/34* (2013.01); *H01J 2237/2007* (2013.01)

(58) Field of Classification Search
USPC .......................................................... 427/569
See application file for complete search history.

(56) References Cited

U.S. PATENT DOCUMENTS

| | | | | |
|---|---|---|---|---|
| 4,793,908 | A * | 12/1988 | Scott | C23C 14/221 |
| | | | | 204/192.15 |
| 5,242,537 | A * | 9/1993 | Nelson | H10N 15/10 |
| | | | | 216/76 |
| 5,482,602 | A * | 1/1996 | Cooper | F16C 33/00 |
| | | | | 427/523 |
| 5,986,264 | A * | 11/1999 | Grunewald | H01J 37/28 |
| | | | | 250/492.21 |
| 6,863,786 | B2 * | 3/2005 | Blinn | A61F 2/30767 |
| | | | | 216/66 |
| 7,838,083 | B1 * | 11/2010 | Youchison | C23C 14/48 |
| | | | | 427/595 |
| 7,862,694 | B2 * | 1/2011 | Konishi | G11B 5/255 |
| | | | | 204/298.34 |
| 8,878,147 | B2 * | 11/2014 | Robinson | G01Q 30/20 |
| | | | | 250/492.1 |
| 11,227,741 | B2 * | 1/2022 | Hegde | H01J 37/1474 |
| 2001/0015319 | A1 * | 8/2001 | Choe | C23C 14/086 |
| | | | | 204/192.15 |
| 2003/0096711 | A1 * | 5/2003 | Saito | H10N 60/0856 |
| | | | | 204/192.24 |
| 2004/0231971 | A1 * | 11/2004 | Becker | G03F 1/78 |
| | | | | 430/5 |
| 2005/0184254 | A1 * | 8/2005 | Matsumoto | H01J 37/3171 |
| | | | | 257/E21.334 |
| 2005/0191409 | A1 | 9/2005 | Murrell et al. | |
| 2009/0098306 | A1 | 4/2009 | Druz et al. | |
| 2009/0200491 | A1 * | 8/2009 | Hino | H01J 37/3171 |
| | | | | 250/492.3 |
| 2011/0089321 | A1 | 4/2011 | Glavish et al. | |
| 2012/0097533 | A1 | 4/2012 | Nomura et al. | |
| 2012/0145535 | A1 * | 6/2012 | Kamiya | H01J 37/302 |
| | | | | 204/298.36 |
| 2013/0206583 | A1 * | 8/2013 | Druz | C23C 14/221 |
| | | | | 204/192.11 |
| 2014/0014497 | A1 * | 1/2014 | Druz | C23C 14/16 |
| | | | | 204/192.11 |
| 2014/0227460 | A1 * | 8/2014 | Hegde | H01J 37/3476 |
| | | | | 427/595 |
| 2015/0069017 | A1 * | 3/2015 | Buonodono | H01J 37/32541 |
| | | | | 118/712 |
| 2015/0090583 | A1 * | 4/2015 | Kodaira | H01J 37/32357 |
| | | | | 204/192.34 |
| 2015/0303028 | A1 * | 10/2015 | Kamiya | H01J 37/20 |
| | | | | 204/298.36 |
| 2016/0005957 | A1 * | 1/2016 | Kodaira | H01L 21/3065 |
| | | | | 438/3 |
| 2017/0098458 | A1 * | 4/2017 | Kamiya | H01J 37/32422 |
| 2018/0061689 | A1 * | 3/2018 | Bluck | H01L 21/768 |
| 2019/0148109 | A1 * | 5/2019 | Yun | H01L 21/67069 |
| | | | | 156/345.55 |
| 2020/0176214 | A1 * | 6/2020 | Pearson | H01J 37/3053 |

FOREIGN PATENT DOCUMENTS

| | | |
|---|---|---|
| JP | H07126834 A | 5/1995 |
| JP | H11 67142 A | 3/1999 |
| JP | 2010270354 A | 12/2010 |
| JP | 5 649428 B2 | 1/2015 |
| JP | 2019021439 A * | 2/2019 |

OTHER PUBLICATIONS

Lautenschlager T et al: Ion beam sputtering of Ti: Influence of process parameters on angular and energy distribution of sputtered and backscattered particles, Nuclear Instruments & Methods in Physics Research. Section B: Beam Interactions With Materials and Atoms, Elsevier BV, NL, vol. 385, Sep. 6, 2016 (Sep. 6, 2016), pp. 30-39, XP029738685, ISSN: 0168-583X, DOI: 10.1016/J.NIMB. 2016.08.017 abstract, figures 1,2.

* cited by examiner

10

30

40

40

40

20

10

30

40

40

40

40

50

50

20

VIRTUAL SHUTTER IN ION BEAM SYSTEM

TECHNICAL FIELD

The present disclosure relates to the field of charged particle sources including plasma sources for direct etching and deposition, broad-beam ion sources for ion beam deposition and etching, and electron sources for surface modification.

BACKGROUND

As shown in FIG. 1A, a typical ion beam etching system 10 has a substrate 30 arranged on a wafer stage 20 that is irradiated with positive ions in an ion beam 40 from an ion source which etch the substrate 20. An ion beam etching system 10 includes an ion source which extracts positive ions from a plasma using an extraction electrode. The wafer stage 20 is placed at a position where the substrate squarely faces the ion beam 40 from the ion source under vacuum. In general, the ion beam etching system 10 also includes an electron source (neutralizer) which emits electrons to neutralize the positive ions extracted from the ion source. A physical shutter is mechanically moved into a position between the ion source and the wafer stage 20 wherein the physical shutter shields the substrate 30 from exposure to the ion beam 40 when the physical shutter is in the appropriate position. This shielding with the physical shutter can be done for a brief period of time to allow the ion beam 40 to be stabilized. Thus, the physical shutter is used to start and end the etching process within the ion beam etching system. In addition, the physical shutter device prevents the ion beam 40 from hitting the internal surfaces of the vacuum chamber that would be exposed to the ion beam 40 if no wafer stage 20 was present during the etching operation of the ion beam etching system 10.

As shown in FIG. 2A, a typical ion beam sputter deposition system 10, has an ion neutral source direct an ion beam 40 onto a sputtering target 45 which results in an energetic particle beam of sputtered material 42. A substrate 30 is arranged on a wafer stage 20 and is irradiated with the sputtered material 42 from the sputtering target 45 which deposits on the substrate 30. A physical shutter is mechanically moved into a position between the sputtered material 42 from the sputtering target 45 and the wafer stage 20 wherein the physical shutter shields the substrate 30 from exposure to the energetic particle beam of sputtered material 42 from the sputtering target 45. This shielding with the physical shutter can be done for a brief period of time to allow the energetic particle beam of sputtered material 42 from the sputtering target 45 to be stabilized. Thus, the physical shutter is used to start and end the deposition process within the ion beam deposition system 10. In addition, the physical shutter isolates the substrate 30 from the sputtering target 45 when the sputtering target is to be cleaned within the ion beam deposition system 10.

A typical substrate can include many devices and may be covered with photoresist masks or other type of masks. The devices can be processed with ion beam exposure to etch the desired shape of the devices on the substrate. Or, sputtered material from a target can be deposited on the substrate.

SUMMARY OF THE INVENTION

The present invention achieves a virtual shutter within a sputtering system using a unique method to eliminate the need for a virtual. In accordance with the present disclosure, the need for a physical shutter can be eliminated by tilting the substrate to angles greater than or equal to 90 degrees or less than or equal to minus 90 degrees in an ion beam system. These stated tilt angles of the substrate achieve a virtual shutter by "hiding" the substrate to an ion beam within an ion beam etching system or "hiding" the substrate to sputtered material from a target exposed to an ion beam in an ion beam deposition system.

According to one aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the wafer stage with the substrate is oriented so that the top surface of the substrate is at an angle of greater than 90 degrees to the major dimension of the energetic particle beam or less than minus 90 degree to the major dimension of the energetic particle beam; orienting the wafer stage with the substrate so that the top surface of the substrate is at an angle greater than 90 degrees or less than minus 90 degrees to the major dimension of the energetic particle beam after stabilization of the energetic particle beam; and exposing the plurality of features on the top surface of the substrate to the energetic particle beam while the wafer stage with the substrate is oriented so that the top surface of the substrate is at an angle greater than 90 degrees or less than minus 90 degrees to the major dimension of the energetic particle beam in a treatment zone.

According to another aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the edge of the substrate is normal to the major dimension of the energetic particle beam and while the edge of the substrate is exposed to the energetic particle beam; orienting the wafer stage with the substrate so that the top surface of the substrate is exposed to the major dimension of the energetic particle beam; and exposing the plurality of features on the top surface of the substrate to the energetic particle beam in a treatment zone.

According to another aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the bottom surface of the substrate is oriented toward the major dimension of the energetic particle beam; orienting the wafer stage with the substrate so that the top surface of the substrate is exposed to the major dimension of the energetic particle beam; and exposing the plurality of features on the top surface of the substrate to the energetic particle beam in a treatment zone.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

Figures 2A, 2B:
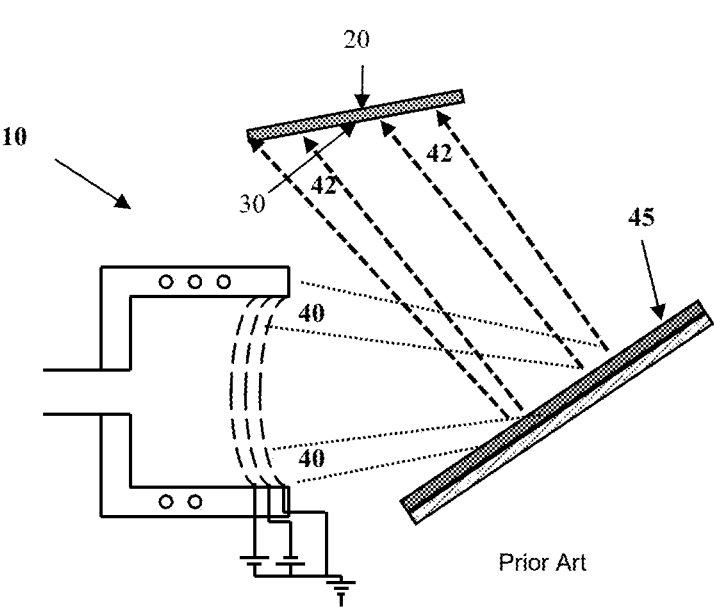

1B illustrates an ion beam etching system method according to one embodiment of the present invention;

FIG. 2A illustrates a typical prior art ion beam deposition system; and

FIG. 2B illustrates an ion beam deposition system method according to one embodiment of the present invention.

Similar reference characters refer to similar parts throughout the several views of the drawings.

DETAILED DESCRIPTION

Present ion beam systems have added cost for the use of a physical shutter due to the motion axis for the shutter; periodic maintenance of the physical shutter; and an additional vacuum feedthrough for the physical shutter. Further, the use of a physical shutter limits the tilt angle range of the substrate due to constraints of space required to open the physical shutter. Lastly, a physical shutter reduces system reliability due to the proximity to substrate surface which results in potential particle generation on the substrate from the physical shutter.

In Ion Beam systems that have substrate tilt and rotate capability, the need for a physical shutter can be eliminated by tilting the substrate to a "hide" position as described in the present invention.

When substrate is tilted to the hide position, there is very little amount of etching of the substrate or deposition on the substrate within the respective ion beam system. However, at the hide position, if the substrate is not rotated, some areas of the substrate may still see small, yet measurable amounts of etch or deposition in some areas of the substrate. Thus, by rotation of the substrate while at the hide position, the amount of etch or deposition can be virtually eliminated.

In Ion Beam systems, the parasitic etch of the substrate or the deposition on the substrate during ignition of the ion source and stabilization of the ion source can be virtually eliminated by tilting the substrate to the hide position and rotating the substrate during any exposure to the ion beam. After the ion source is stabilized, the ion source may be allowed to run without ion extraction, while the wafer stage is tilted to the processing tilt angle, and once at the processing tilt angle, the substrate may be exposed to the ion beam. A preferred way to run the ion source without ion extraction is to set the ion optics voltages to zero volts. In case of ion source instabilities, ion extraction energy may be set to zero volts, the substrate tilted to the hide position while the substrate is rotated. Then, the ion source may be re-stabilized and the process may be resumed. Tilt angles of equal or larger than 90 degree or less than or equal to minus 90 degrees of the substrate within the ion beam system allow little to no exposure of the substrate to the ion beam.)

Figure 1A:
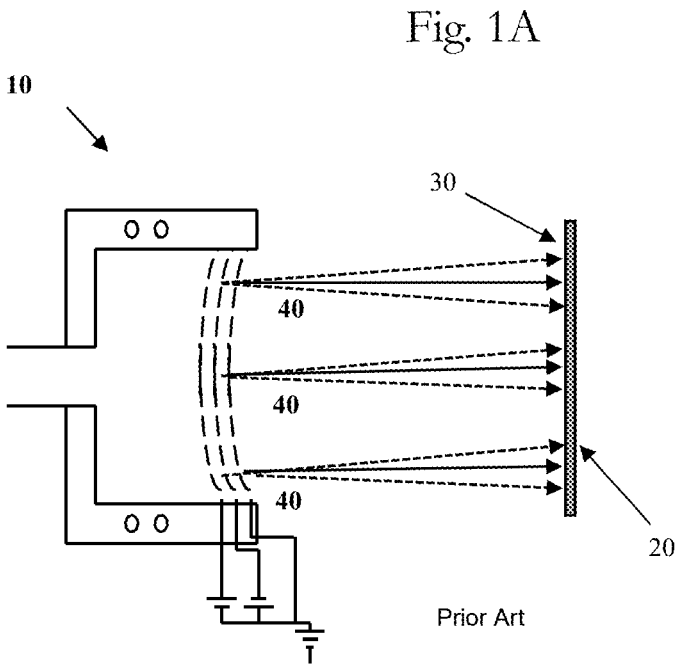
FIG. 1A illustrates a typical prior art ion beam etching system.
Figure 1B:
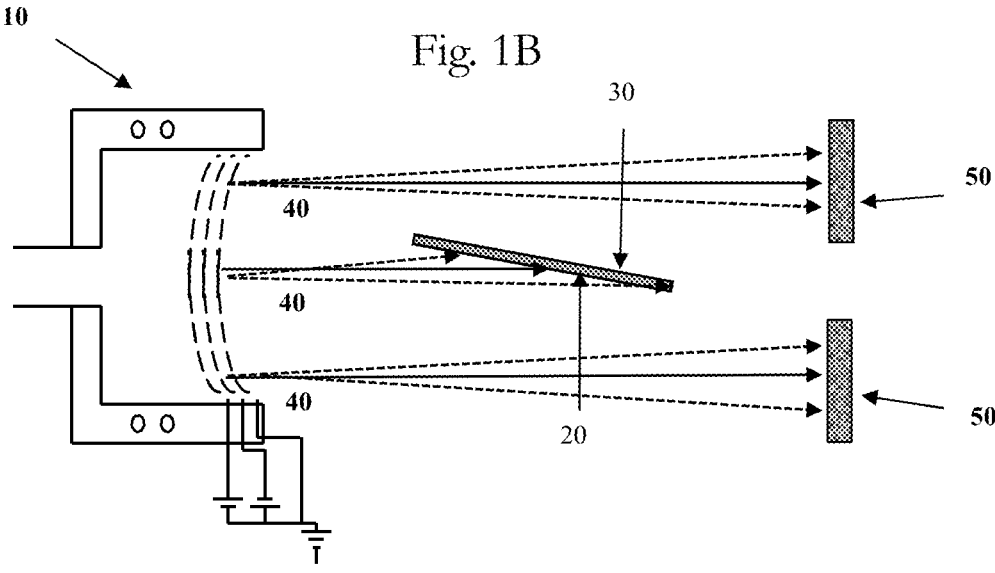

As shown in FIG. 1B, in one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the wafer stage 20 with the substrate 30 is oriented so that the top surface of the substrate 30 is at an angle of greater than 90 degrees to the major dimension of the energetic particle beam 40 or less than minus 90 degree to the major dimension of the energetic particle beam 40. The stabilization of the energetic particle beam 40 can be performed for a time period of at least 1 second. The substrate 30 can be rotated during the stabilization of the energetic particle beam 40. After the stabilization of the energetic particle beam, the wafer stage 20 with the substrate 30 is oriented so that the top surface of the substrate 30 is at an angle greater than 90 degrees or less than minus 90 degrees to the major dimension of the energetic particle beam 40. Then, the plurality of features on the top surface of the substrate 30 are exposed to the energetic particle beam 40 while the wafer stage 20 with the substrate 30 is oriented so that the top surface of the substrate 30 is at an angle greater than 90 degrees or less than minus 90 degrees to the major dimension of the energetic particle beam 40 in a treatment zone.

As shown in FIG. 2B, in one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the wafer stage 20 with the substrate 30 is oriented so that the top surface of the substrate 30 is at an angle of greater than 90 degrees to the major dimension of the energetic particle beam of sputtered material 42 or less than minus 90 degree to the major dimension of the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is at an angle greater than 90 degrees or less than minus 90 degrees to the major dimension of the energetic particle beam of sputtered material 42. Then, the plurality of features on the top surface of the substrate 30 are exposed to the energetic particle beam of sputtered material 42 while the wafer stage 20 with the substrate 30 is oriented so that the top surface of the substrate 30 is at an angle greater than 90 degrees or less than minus 90 degrees to the major dimension of the energetic particle beam of sputtered material 42 in a treatment zone.

In one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the edge of the substrate 30 is normal to the major dimension of the energetic particle beam 40 and while the edge of the substrate 30 is exposed to the energetic particle beam 40. The stabilization of the energetic particle beam 40 can be performed for a time period of at least 1 second. The substrate 30 can be rotated during the stabilization of the energetic particle beam 40. After the stabilization of the energetic particle beam 40, the wafer stage 20 with the substrate 30 is oriented so that the top surface of the substrate 30 is exposed to the major dimension of the energetic particle beam 40. Then, the plurality of features on the top surface of the substrate 30 are exposed to the energetic particle beam 40 in a treatment zone.

In one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the edge of the substrate 30 is normal to the major dimension of the energetic particle beam of sputtered material 42 and while the edge of the substrate 30 is exposed to the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is exposed to the major dimension of the energetic particle beam of sputtered material 42. Then, the plurality of features on the top surface of the substrate 30 are exposed to the energetic particle beam of sputtered material 42 in a treatment zone.

In one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the bottom surface of the substrate 30 is oriented toward the major dimension of the energetic particle beam 40. The stabilization of the energetic particle beam 40 can be performed for a time period of at least 1 second. The substrate 30 can be rotated during the stabilization of the energetic particle beam 40. After the stabilization of the energetic particle beam 40, the wafer stage 20 with the substrate 30 is oriented so that the top surface of the substrate 30 is exposed to the major dimension of the energetic particle beam 40. Then, the plurality of features on the top surface of the substrate 30 are exposed to the energetic particle beam 40 in a treatment zone.

In one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the bottom surface of the substrate 30 is oriented toward the major dimension of the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is exposed to the major dimension of the energetic particle beam of sputtered material 42. Then, the plurality of features on the top surface of the substrate 30 are exposed to the energetic particle beam of sputtered material 42 in a treatment zone.

Low process pressure within the ion beam etch system makes for a long "mean free path" relative to the distance to the substrate from the ion source. Ion beam etch processes are directional. This allows the substrate to be tilted to angles that can reduce etching of the substrate. For example, the substrate may be tilted so that the substrate surface has no line of sight to the ion source. This may be done by tilting the substrate to angles greater than or equal to 90 degrees, or angles less than or equal to negative 90 degrees to the major dimension of the particle beam (ions from the ion source). The substrate being held in such positions during the ion source ignition allows little to no exposure of the substrate to ions from the ion source.

Low process pressure within the ion beam deposition system makes for a long "mean free path" relative to the distance to the substrate from the target. Ion beam deposition processes are directional. This allows the substrate to be tilted to angles that can reduce deposition on the substrate. For example, the substrate may be tilted so that the substrate surface has no line of sight to the target. This may be done by tilting the substrate to angles greater than or equal to 90 degrees, or angles less than or equal to negative 90 degrees to major dimension of the particle beam (sputtered material from the target). The substrate being held in such positions during the ion source ignition allows little to no exposure of the substrate to sputtered material from the target.

In any embodiment of the present invention, exposure of the substrate to ions from the ion source in these positions may be further reduced by use of a low sputter yield material in areas of the process chamber where there is a line of sight of both the substrate surface and the ion source. As shown in FIG. 1B, low sputter yield material absorbers 50 may be placed strategically in areas that are in line of sight of both the substrate surface in hide position and the ion source in case of ion beam etch to further minimize substrate etching in hide position. Alternatively, as shown in FIG. 2B, low sputter yield material absorbers 50 may be placed strategically in areas that are in line of sight of both the substrate surface in the hide position and the target in case of ion beam deposition.

In any embodiment of the present invention, typical source stabilization time is less than 10 seconds. Thus, the substrate will experience about 1 angstrom of etch or deposition at the hide position with rotation, during the ion source ignition and stabilization process.)

In any embodiment of the present invention, in an ion beam deposition system, the targets may be cleaned and preconditioned while the substrate is titled to the hide position. Additionally, the substrate can be rotated during the cleaning and/or preconditioning of the target.

In any embodiment of the present invention, the voltage to a beam grid can be reduced while the wafer stage with the substrate is being brought into a processing position and while a plasma remains ignited. Alternatively, the voltage to a beam grid can be reduced and the voltage to a suppressor grid can be reduced while the wafer stage with the substrate is being brought into a processing position and while a plasma remains ignited.

In any embodiment of the present invention, the stage that holds the substrate during exposure to the sputtered material from the target can rotate the substrate about a central axis. The stage can tilt the substrate with respect to the sputtered material for at least a portion of the deposition process. The deposition plume of sputtered material from the target can be directed at any angle with respect to the substrate surface by tilting the substrate stage. Provisions may be made on the wafer stage to cool the substrate during the deposition process to prevent thermal damage to the devices on the substrate. The substrate may also be heated to a specific temperature to enhance the ion beam deposition process.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further, and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. A method of processing a substrate, the method comprising:

placing the substrate on a wafer stage within a shutterless ion beam system, the substrate having a top surface having a plurality of features, an edge and a bottom surface;

tilting the wafer stage with the substrate to a hide position within the shutterless ion beam system;

igniting an energetic particle beam having a radial flux distribution over at least a portion of a major dimension thereof, said ignition of the energetic particle beam occurring after the wafer has been tilted to the hide position;

stabilizing said energetic particle beam and rotating the substrate on the wafer stage during stabilization while the substrate on the wafer stage is in the hide position within the shutterless ion beam system;

orienting the wafer stage with the substrate after the stabilizing step so that the plurality of features on the top surface of the substrate are exposed to the major dimension of the energetic particle beam; and exposing the plurality of features on the top surface of the substrate to the energetic particle beam in a treatment zone.

2. The method according to claim 1, wherein the stabilization of the energetic particle beam is performed for a time period of at least 1 second while the substrate on the wafer stage is in the hide position within the shutterless ion beam system.

3. The method according to claim 1, further comprising reducing voltage to a beam grid while the plurality of the features on the top surface of the substrate are being brought into a processing position and while a plasma remains ignited.

4. The method according to claim 1, further comprising reducing voltage to a beam grid and reducing voltage to a suppresor grid while the plurality of the features on the top surface of the substrate are being brought into a processing position and while a plasma remains ignited.

5. A method of processing a substrate, the method comprising:

placing the substrate on a wafer stage within a shutterless ion beam deposition system, the substrate having a top surface having a plurality of features, an edge and a bottom surface;

igniting an energetic particle beam within the ion beam deposition system;

tilting the wafer stage with the substrate to a hide position within the shutterless ion beam deposition system;

focusing the energetic particle beam on a sputtering target;

generating an energetic particle beam of sputtered material from the sputtering target using the energetic particle beam, said generation of the energetic particle beam of sputtered material occurring after the wafer has been tilted to the hide position;

stabilizing said energetic particle beam of sputtered material and rotating the substrate on the wafe stage during stabilization while the substrate on the wafer stage is in the hide position within the shutterless ion beam deposition system;

orienting the wafer stage with the substrate after the stabilizing step so that the plurality of features on the top surface of the substrate are exposed to the energetic particle beam of sputtered material; and exposing the plurality of features on the top surface of the substrate to the energetic particle beam of sputtered material in a treatment zone.

* * * * *